(12) United States Patent
Suzuki et al.

(10) Patent No.: US 9,786,491 B2
(45) Date of Patent: Oct. 10, 2017

(54) FORMATION OF SIOCN THIN FILMS

(71) Applicant: ASM IP Holding B.V., Almere (NL)

(72) Inventors: Toshiya Suzuki, Helsinki (FI); Viljami J. Pore, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 9 days.

(21) Appl. No.: 14/939,984

(22) Filed: Nov. 12, 2015

(65) Prior Publication Data

US 2017/0140924 A1    May 18, 2017

(51) Int. Cl.
  *H05H 1/24* (2006.01)
  *H01L 21/02* (2006.01)

(52) U.S. Cl.
  CPC .. *H01L 21/02126* (2013.01); *H01L 21/02274* (2013.01)

(58) Field of Classification Search
  CPC ............... H01L 21/02274; H01L 21/02126
  USPC ......................................................... 427/569
  See application file for complete search history.

(56) References Cited

U.S. PATENT DOCUMENTS

| | | |
|---|---|---|
| 3,708,728 A | 1/1973 | Sterling et al. |
| 3,925,337 A | 12/1975 | Heiberger |
| 4,058,430 A | 11/1977 | Suntola et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |

(Continued)

FOREIGN PATENT DOCUMENTS

| | | |
|---|---|---|
| EP | 0387403 | 9/1990 |
| EP | 0394054 | 10/1990 |

(Continued)

OTHER PUBLICATIONS

1988RD-0296076 (Nov. 20, 1998), Field effect transistor structure with improved transconductant—contg. spacer-less conducting gate oxide, and tungsten deposited on source and drain, EAST Version 2.0.1.4 Patent-Assignee: Anonymous[ANON], Sep. 19, 2005.

(Continued)

*Primary Examiner* — Kelly M Gambetta
(74) *Attorney, Agent, or Firm* — Knobbe, Martens, Olson & Bear LLP

(57) ABSTRACT

Methods for depositing silicon oxycarbonitride (SiOCN) thin films on a substrate in a reaction space are provided. The methods can include at least one plasma enhanced atomic layer deposition (PEALD) cycle including alternately and sequentially contacting the substrate with a silicon precursor and a second reactant that does not include oxygen. In some embodiments the methods allow for the deposition of SiOCN films having improved acid-based wet etch resistance.

27 Claims, 5 Drawing Sheets

(56) References Cited

U.S. PATENT DOCUMENTS

| | | |
|---|---|---|
| 5,306,666 A | 4/1994 | Izumi |
| 5,316,793 A | 5/1994 | Wallace et al. |
| 5,342,652 A | 8/1994 | Foster et al. |
| 5,482,262 A | 1/1996 | Hayakawa et al. |
| 5,595,784 A | 1/1997 | Kaim et al. |
| 5,603,771 A | 2/1997 | Seiberras et al. |
| 5,618,395 A | 4/1997 | Gartner |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,763 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,405,158 B2 | 7/2008 | Lai et al. |
| 7,416,981 B2 | 8/2008 | Lee et al. |
| 7,794,798 B2 | 9/2010 | Hautala |
| 9,455,138 B1 | 9/2016 | Fukazawa et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0015764 A1* | 1/2003 | Raaijmakers ..... H01L 21/02145 257/424 |
| 2003/0026989 A1 | 2/2003 | George et al. |
| 2003/0031793 A1 | 2/2003 | Chang et al. |
| 2003/0049931 A1 | 3/2003 | Byun et al. |
| 2003/0072975 A1 | 4/2003 | Shero et al. |
| 2003/0082296 A1 | 5/2003 | Elers et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0271813 A1 | 12/2005 | Kher et al. |
| 2006/0019494 A1 | 1/2006 | Cao et al. |
| 2006/0078679 A1 | 4/2006 | Elers et al. |
| 2006/0079090 A1 | 4/2006 | Elers et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2007/0054046 A1 | 3/2007 | Ishizaka et al. |
| 2007/0148350 A1 | 6/2007 | Rahtu et al. |
| 2007/0218670 A1 | 9/2007 | Ishizaka |
| 2008/0102204 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |
| 2009/0104791 A1* | 4/2009 | Nemani ............... C23C 16/045 438/788 |
| 2009/0211526 A1 | 8/2009 | Tanaka et al. |
| 2009/0315093 A1 | 12/2009 | Li et al. |
| 2012/0269962 A1 | 10/2012 | Blomberg et al. |
| 2013/0078454 A1 | 3/2013 | Thompson et al. |
| 2013/0196082 A1* | 8/2013 | Spence ..................... C07F 7/10 427/578 |
| 2015/0376211 A1 | 12/2015 | Girard et al. |

FOREIGN PATENT DOCUMENTS

| | | |
|---|---|---|
| EP | 0442490 | 8/1991 |
| EP | 0526779 | 2/1993 |
| EP | 0528779 | 2/1993 |
| EP | 0573033 | 12/1993 |
| EP | 0774533 | 5/1997 |
| EP | 0899779 | 3/1999 |
| EP | 1 158 070 | 11/2001 |
| EP | 1167567 | 1/2002 |

(56) References Cited

FOREIGN PATENT DOCUMENTS

| | | |
|---|---|---|
| JP | 58033841 | 2/1983 |
| JP | 6037041 | 2/1994 |
| JP | 6069157 | 3/1994 |
| JP | 7230957 | 8/1995 |
| JP | 8264530 | 10/1996 |
| JP | 09-087857 | 3/1997 |
| KR | 2003-0016346 | 2/2003 |
| KR | 2003-0057938 | 7/2003 |
| KR | 2003-0093575 | 12/2003 |
| KR | 2004-0060402 | 7/2004 |
| KR | 2004-0079173 | 9/2004 |
| KR | 2004-0079175 | 9/2004 |
| KR | 2004-0100767 | 12/2004 |
| KR | 2005-0000168 | 1/2005 |
| WO | WO 96/17107 | 6/1996 |
| WO | WO 96/18756 | 6/1996 |
| WO | WO 98/51838 | 11/1998 |
| WO | WO 99/37655 | 7/1999 |
| WO | WO 00/01006 | 1/2000 |
| WO | WO 00/04704 | 1/2000 |
| WO | WO 00/40772 | 7/2000 |
| WO | WO 00/47404 | 8/2000 |
| WO | WO 00/47796 | 8/2000 |
| WO | WO 00/54320 | 9/2000 |
| WO | WO 00/55895 | 9/2000 |
| WO | WO 00/63957 | 10/2000 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/53565 | 7/2001 |
| WO | WO 01/66832 | 9/2001 |
| WO | WO 01/78213 | 10/2001 |
| WO | WO 01/88972 | 11/2001 |
| WO | WO 2004/077515 | 9/2004 |
| WO | WO 2006/080782 | 8/2006 |
| WO | WO 2007/041089 | 4/2007 |
| WO | WO 2008/051851 | 5/2008 |
| WO | WO 2008/137399 | 11/2008 |

OTHER PUBLICATIONS

Aarik et al., "Influence of substrate temperature on atomic layer growth and properties of HfO2 thin films", Thin Solid Films, vol. 340, 1999, pp. 110-116.

Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.

Andricacos et al., Damascene copper electroplating for chip, IBM Jour. Research and Dev., 1998, vol. 42, Issue 5, pp. 567-574.

Bain et al., Deposition of tungsten by plasma enhanced chemical vapour deposition, J. Phys. IV France, 1999, vol. 9, pp. 827-833.

Chang et al, "Chemical Vapor Deposition of Tantalum Carbide and Carbonitride Thin Films from Me3CE=Ta(CH2CMe3)3 (E=CH, N)," J. Mater. Chem. 13:365-369 (2003).

Chookarjorn et al, "Design of Stable Nanocrystalline Alloys," Science Magazine, vol. 337, pp. 951-954, Aug. 24, 2012.

Elers et al., NbC15 as a precursor in atomic layer epitaxy, Applied Surface Science, Jul. 9, 1994, vol. 82/83, pp. 468-474.

Favis et al., Atomic layer epitaxy of silicon, silicon/germanium and silicon carbide via extraction/exchange processes, Avail. NTIS. Report, 1991, pp. 33.

Fuyuki et al., Atomic layer epitaxy controlled by surface superstructures in silicon carbide, Thin Solid Films, 1993, vol. 225, Issue 1-2, pp. 225-229.

Fuyuki et al., Atomic layer epitaxy of cubic silicon carbide by gas source MBE using surface superstructure, J. Cryst. Growth, 1989, vol. 95, Issue 1-4, pp. 461-463.

Girolami et al., Tailored Organometallics as Low-Temperature CVD Precursors to Thin Films, Materials Research Society Symposium Proceedings, 1988, vol. 121, pp. 429-438.

Gordon et al., "A Kinetic Model for Step Coverage by Atomic Layer Deposition in Narrow Holes or Trenches", Chemical Vapor Deposition, 2003, vol. 9, No. 2, pp. 73-78.

Hara et al., Atomic layer control of .beta.-silicon carbide (001) surface, Springer Proc. Phys., 1992, pp. 90-95.

Hiltunen et al., Nitrides of titanium, niobium, tantalum and molybdenum grown as thin films by the atomic layer epitaxy method, Thin Solid Films, 1988, vol. 166, pp. 149-154.

Hultman et al., "Review of the Thermal and Mechanical Stability of TiN-based Thin Films" Zeitscrift Fur Metallkunde 90 (10): 803-813 (1999).

Ihanus et al., "ALE growth of $ZnS_{1-x}Se_x$ thin films by substituting surface sulfur with elemental selenium," Appl. Surface Sci., 112:154-158 (1997).

International Search Report and Written Opinion dated Apr. 7, 2008, Application No. PCT/US2007/082131.

International Search Report and Written Opinion dated Jun. 25, 2015 in Application No. PCT/US2015/023492.

Jehn et al., Gmelin Handbook of Inorganic and Organometallic Chemistry, 8th Edition, 1993, vol. A 5b, Issue 54, pp. 131-154.

Jeon et al., A Study on the Characteristics of TiN Thin Film Deposited by Atomic Layer Chemical Vapor Deposition Method, J. Vac .Sci. Technol. A, 2000, vol. 18, Issue 4, pp. 1595-1598.

Juppo et al., Deposition of copper films by an alternate supply of CuCI and Zn, J. Vac. Sci. Technol A, Jul./Aug. 1997, vol. 15, Issue 4, pp. 2330-2333.

Kattelus et al., "Electrical Properties of Tantalum Based Composite Oxide Films," Mat. Res. Soc. Symp. Proc. vol. 284, pp. 511-516 (1993).

Kattelus et al., "Layered tantalum-aluminum oxide films deposited by atomic layer epitaxy," Thin Solid Films, Vo. 225, pp. 296-298 (1993).

Kim et al., Atomic-layer-deposited WNxCy thin films as diffusion barrier for copper metallization, Applied Physics Letters, Jun. 23, 2003, vol. 82, Issue 25, pp. 4486-4488.

Kim et al., "Novel capacitor technology for high density stand-alone and embedded DRAMs," IEEE International Electron Devices Meeting, IEDM (2000).

Kirk-Othmer, Encyclopedia of Chemical Technology, John Wiley & Sons, Inc., 1992, vol. 4, pp. 841-878.

Klaus et al., Atomic Layer Deposition of Tungsten Nitride Films Using Sequential Surface Reactions, Journal of the Electrochemical Society, 2000, vol. 147, Issue 3, pp. 1175-1181.

Klaus et al., Atomic layer deposition of tungsten using sequential surface chemistry with a sacrificial stripping reaction, Thin Solid Films, 2000, vol. 360, pp. 145-153.

Klaus et al., Atomic layer deposition of tungsten and tungsten nitride using sequential surface reactions, AVS 46$^{th}$ International Symposium, 1999, Seattle, WA, US.

Klaus et al., Atomically controlled growth of tungsten and tungsten nitride using sequential surface reactions, Applied Surface Science, 2000, vol. 162-163, pp. 479-491.

Kukli et al., Properties of $(Nb_{1-x}Ta_x)_2O_5$ Solid Solutions and $(Nb_{1-x}Ta_x)_2O_5$—$ZrO_2$ Nanolaminates Growth by Atomic Layer Epitaxy, , NanoStructured Materials, 1997, vol. 8, pp. 785-793.

Lai et al., Precursors for Organometallic Chemical Vapor Deposition of Tungsten Carbide Films, Chem. Mater., 1995, vol. 7, pp. 2284-2292.

Lakomaa et al., "Surface reactions in $Al_2O_3$ growth from trimethylaluminum and water by atomic layer epitaxy," Applied Surface Science, vol. 107, pp. 107-115 (1996).

Leskelä et al., ALD precursor chemistry: Evolution and future challenges, Jour. Phys. IV France 9, 1999, pp. 837-852.

Ludviksson et al., Low-Temperature Thermal CVD of Ti—Al Metal Films Using a Strong Reducing Agent, Chem. Vap. Deposition, 1998, vol. 4, Issue 4, pp. 129-132.

Martensson, Use of atomic layer epitaxy for fabrication of Si/TiN/Cu structures, J. Vac. Sci. Technol. B, Sep./Oct. 1999, vol. 17, Issue 5, pp. 2122-2128.

Martensson et al., Atomic Layer Epitaxy of Copper and Tantalum, Chemical Vapor Deposition, 1997, vol. 3, Issue 1, pp. 45-50.

(56) References Cited

OTHER PUBLICATIONS

Martensson et al., Cu(THD)$_2$ as Copper Source in Atomic Layer Epitaxy, Electrochemical Society Proceedings, vol. 97-25, (1997) pp. 1529-1536.
Matsunami et al., Hetero-interface control and atomic layer epitaxy of SiC, Applied Surface Science, 1997, vol. 112, pp. 171-175.
Min et al., Atomic Layer Deposition of TiN Films by Alternate Supply of Tetrakis (ethylmethylamino)—Titanium and Ammonia, Jpn. J. Appl. Phys., 1998, vol. 37, pp. 4999-5004.
Min et al., Atomic Layer Deposition of TiN Thin Films by Sequential Introduction of Ti Precursor and HN$_3$, Mat. Res. Soc. Symp. Proc., 1998, vol. 514, pp. 337-342.
Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.
Polyakov et al., Growth of GaBN Ternary Solutions by Organometallic Vapor Phase Epitaxy, Journal of Electronic Materials, 1997, vol. 26, Issue 3, pp. 237-242.
Ritala et al., Atomic layer epitaxy growth of TiN thin films, J. Electrochem. Soc., 1995, vol. 142, Issue 8, pp. 2731-2737.
Ritala et al., Atomic Layer Epitaxy Growth of TiN Thin Films from TiI$_4$ and NH$_3$, J. Electrochem. Soc., Aug. 1998, vol. 145, Issue 8, pp. 2914-2920.
Ritala et al., "Controlled Growth of TaN, Ta$_3$N$_5$, and TaOxNy Thin Films by Atomic Layer Deposition", Chem. Mater., 1999, vol. 11, pp. 1712-1718.
Ritala et al., Effects of intermediate zinc pulses on properties of TiN and NbN films deposited by atomic layer epitaxy, Appl. Surf. Sci., 1997, vol. 120, pp. 199-212.
Ritala et al., Perfectly conformal TiN and Al2O3 films deposited by atomic layer deposition, Chem. Vapor Deposition, 1999, vol. 5, pp. 7-9.
Ritala et al., Surface roughness reduction in atomic layer epitaxy grown of titanium dioxide thin films, Thin Solid Films, vol. 249, pp. 155-162 (1994).
Sadayuki et al., Sub-atomic layer growth of SiC at low temperatures, Japanese Journal of Applied Physics, 1995, vol. 34, Issue 11, pp. 6166-6170.
Sherman et al., Plasma enhanced atomic layer deposition of Ta for diffusion barrier applications, AVS 46$^{th}$ International Symposium, Oct. 26, 1999, Seattle, WA, US.
Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties", Chemical Vapor Deposition, 2008, vol. 14, pp. 334-338.
Suntola, "Atomic Layer Epitaxy," Handbook of Crystal Growth 3, Ch. 14, pp. 601-663 (1994).
Tulhoff et al., Ullmann's Encyclopedia of Industrial Chemistry, 5$^{th}$, Completely Revised Edition, 1986, vol. A5, pp. 61-77.
U.S. Appl. No. 10/049,125, filed Aug. 20, 2002 including prosecution history, including but not limited to, Office Action dated Apr. 8, 2004, Office Action dated Jun. 18, 2003, and Office Action dated Oct. 27, 2003.
U.S. Appl. No. 10/242,368, filed Sep. 12, 2002 including prosecution history, including but not limited to, Office Action dated Oct. 20, 2004, Office Action dated Apr. 27, 2004, and Notice of Allowance dated Jul. 19, 2005.
U.S. Appl. No. 10/969,297, filed Oct. 19, 2004 including prosecution history, including but not limited to, Office Action dated Oct. 11, 2006, Office Action dated Apr. 12, 2007, and Notice of Allowance dated Sep. 18, 2007.
U.S. Appl. No. 11/286,203, filed Nov. 22, 2005 including prosecution history, including but not limited to Office Action dated Sep. 28, 2007.
U.S. Appl. No. 11/288,872, filed Nov. 28, 2005 including prosecution history, including but not limited to, Office Action dated Jul. 2, 2007, Office Action dated Jan. 30, 2008, Office Action dated Sep. 9, 2008, Office Action dated Dec. 4, 2008, and Office Action dated Aug. 20, 2009.
U.S. Appl. No. 11/591,845, filed Nov. 1, 2006 including prosecution history, including but not limited to, Office Action dated Sep. 4, 2008, Office Action dated May 28, 2009, and Notice of Allowance dated Sep. 4, 2009.
Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).
Wong et al., Barriers for copper interconnections, Solid State Technology, 1999, pp. 1-7.
Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.
Zhang et al., "High permittivity thin film nanolaminates," Journal of Applied Physics, vol. 87, No. 4, pp. 1921-1924 (2000).

\* cited by examiner

FORMATION OF SIOCN THIN FILMS

BACKGROUND

Field of the Invention

The present disclosure relates generally to the field of semiconductor device manufacturing and, more particularly, to formation of silicon oxycarbonitride (SiOCN) films having desirable chemical resistance properties.

Description of the Related Art

There is increasing need for dielectric materials with relatively low dielectric constant (k) values and relatively low acid-based wet etch rates. Silicon oxycarbonitride may satisfy certain of these requirements. Typically, deposition processes for SiOCN require precursors comprising halides and/or oxygen plasma.

SUMMARY OF THE INVENTION

In some embodiments plasma enhanced atomic layer deposition (PEALD) processes are provided for forming a silicon oxycarbonitride (SiOCN) thin film on a substrate in a reaction space. In some embodiments a PEALD process may comprise at least one deposition cycle comprising contacting a surface of the substrate with a vapor phase silicon precursor to thereby adsorb a silicon species on the surface of the substrate, contacting the adsorbed silicon species with at least one reactive species generated by plasma formed from a gas that does not comprise oxygen, and optionally repeating the contacting steps until a SiOCN film of a desired thickness has been formed. In some embodiments the silicon precursor use in a PEALD process has a formula as in one of the following general formulas:

$$(R^{I}O)_{4-x}Si(R^{II}—NH_2)_x \quad (1)$$

wherein x is an integer from 1 to 4;
$R^{I}$ is independently selected from the group consisting of alkyl; and
$R^{II}$ is an independently selected hydrocarbon;

$$(R^{I}O)_3Si—R^{II}—NH_2 \quad (2)$$

wherein $R^{I}$ is independently selected from the group consisting of alkyl; and
$R^{II}$ is an independently selected hydrocarbon; and $$(R^{I}O)_{4-x}Si(—[CH_2]_n—NH_2)_x \quad (3)$$

wherein x is an integer from 1 to 4;
n is an integer from 1-5; and
$R^{I}$ is independently selected from the group consisting of alkyl.

In some embodiments a ratio of a wet etch rate of the SiOCN thin film to a wet etch rate of thermal silicon oxide may be less than about 5. In some embodiments a ratio of a wet etch rate of the SiOCN thin film to a wet etch rate of thermal silicon oxide may be less than about 0.3. In some embodiments a ratio of a wet etch rate of the SiOCN thin film to a wet etch rate of thermal silicon oxide may be less than about 0.1.

In some embodiments the SiOCN thin film may be deposited on a three-dimensional structure on the substrate. In some embodiments a wet etch rate ratio of a wet etch rate of SiOCN formed on a top surface of the three-dimensional structure to a wet etch rate of the SiOCN formed on a sidewall surface of the three-dimensional structure may be about 1:1 in dilute HF.

In some embodiments the vapor phase silicon precursor may not comprise a halogen. In some embodiments the silicon precursor may comprise (3-aminopropyl)trimethoxysilane (APTMS). In some embodiments the reactive species may comprise hydrogen plasma, hydrogen atoms, hydrogen radicals, or hydrogen ions. In some embodiments the reactive species may be generated from a second reactant comprising a noble gas. In some embodiments the reactive species may further comprise nitrogen plasma, nitrogen atoms, nitrogen radicals, or nitrogen ions. In some embodiments the reactive species may be generated by plasma from a second reactant comprising hydrogen. In some embodiments the second reactant may comprise $H_2$.

In some embodiments the SiOCN thin film may comprise at least 20 at % oxygen. In some embodiments the SiOCN thin film may comprise at least 5 at % carbon. In some embodiments the SiOCN thin film may comprise at least 5 at % nitrogen.

In some embodiments processes are provided for forming a silicon oxycarbonitride (SiOCN) thin film on a substrate in a reaction space. In some embodiments a process may comprise a plurality of deposition cycles, at least one deposition cycle may comprise alternately and sequentially contacting a surface of the substrate with a silicon precursor and a second reactant comprising at least one reactive species. In some embodiments a deposition cycle may be repeated two or more times to form the SiOCN thin film. In some embodiments the silicon precursor may have a general formula:

$$L_nSi(OR^{I})_{4-x-y-z-n}(R^{II}NR^{III}R^{IV})_xH_y(OH)_z$$

wherein n is an integer from 0 to 3, x is an integer from 1 to 4, y is an integer from 0 to 3, z is an integer from 0 to 3; and 4-x-y-z-n is from 0 to 3;
$R^{I}$ is independently selected from the group consisting of alkyl;
$R^{II}$ is an independently hydrocarbon;
$R^{III}$ and $R^{IV}$ are independently selected from the group consisting of alkyl and hydrogen; and
L is independently selected from the group consisting of alkyl and halogens.

In some embodiments the at least one reactive species may be generated by plasma formed from a gas that does not comprise oxygen.

In some embodiments the silicon precursor may have a general formula:

$$L_nSi(OR^{I})_{4-x-n}(R^{II}NR^{III}R^{IV})_x$$

wherein n is an integer from 0 to 3, x is an integer from 1 to 3;
L is independently selected from the group consisting of alkyl and halogens;
$R^{I}$ is independently selected from the group consisting of alkyl;
$R^{II}$ is an independently selected hydrocarbon; and
$R^{III}$ and $R^{IV}$ are independently selected from the group consisting of alkyl and hydrogen.

In some embodiments the silicon precursor may have a general formula:

$$Si(OR^{I})_{4-x-y-z}(R^{II}NR^{III}R^{IV})_xH_y(OH)_z$$

wherein x is an integer from 1 to 4, y is an integer from 0 to 3, z is an integer from 0 to 3;
$R^{I}$ is independently selected from the group consisting of alkyl;
$R^{II}$ is an independently selected hydrocarbon; and
$R^{III}$ and $R^{IV}$ are independently selected from the group consisting of alkyl and hydrogen.

In some embodiments the silicon precursor may have a general formula:

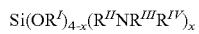

$$Si(OR^I)_{4-x}(R^{II}NR^{III}R^{IV})_x$$

wherein x is an integer from 1 to 4;

$R^I$ is independently selected from the group consisting of alkyl;

$R^{II}$ is an independently selected hydrocarbon; and $R^{III}$ and $R^{IV}$ are independently selected from the group consisting of alkyl and hydrogen.

In some embodiments the silicon precursor may comprise APTMS. In some embodiments at least one deposition cycle may be a PEALD cycle. In some embodiments a reactive species may be generated by applying RF power of from about 100 Watts (W) to about 1000 W to the second reactant. In some embodiments a deposition cycle may be carried out at a process temperature of about 300° C. to about 400° C. In some embodiments the deposition cycle may be carried out at a process temperature of less than about 100° C. In some embodiments the substrate may comprise an organic material.

In some embodiments processes are provided for depositing a silicon oxycarbonitride (SiOCN) thin film on a substrate in a reaction space. In some embodiments such a process may comprise contacting a surface of the substrate with a silicon precursor comprising at least one ligand bonded through carbon to a silicon atom and containing an $NH_2$-group attached to a carbon chain and at least one ligand bonded to the silicon atom through an oxygen atom and in which an alkyl group is bonded to the oxygen atom. In some embodiments a process may further comprise exposing the substrate to a purge gas and/or vacuum to remove excess titanium reactant and reaction byproducts, if any, contacting a surface of the substrate with a second reactant comprising hydrogen, wherein the second reactant comprises at least one reactive species generated by plasma, exposing the substrate to a purge gas and/or vacuum to remove excess second reactant and reaction byproducts, if any, and repeating the contacting steps until a SiOCN thin film of desired thickness has been formed.

DETAILED DESCRIPTION

Figure 1:
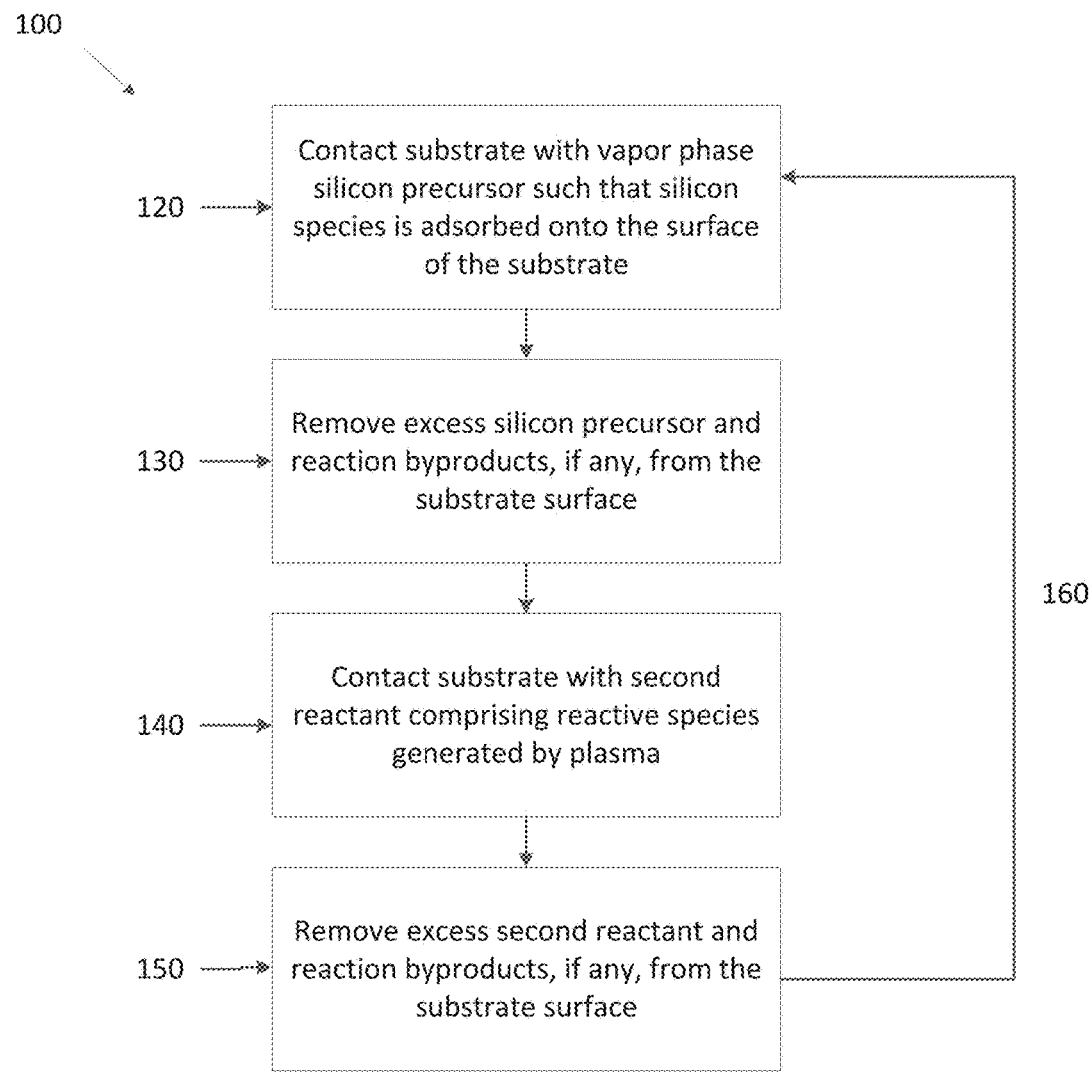
FIG. 1 is a process flow diagram for depositing a silicon oxycarbonitride (SiOCN) thin film by a plasma enhanced atomic layer deposition (PEALD) process according to some embodiments of the present disclosure.

Silicon oxycarbonitride (SiOCN) films have a wide variety of applications, as will be apparent to the skilled artisan, for example in integrated circuit fabrication. More specifically, SiOCN films that display a low etch rate have a wide variety of application, both in the semiconductor industry and outside of the semiconductor industry. SiOCN films may be useful as, for example, etch stop layers, sacrificial layers, low-k spacers, anti-reflection layers (ARL), and passivation layers.

According to some embodiments of the present disclosure, various SiOCN films, precursors, and methods for depositing said films are provided. In some embodiments the SiOCN films have a relatively low wet etch rate, for example in dHF.

In some embodiments SiOCN thin films are deposited on a substrate by plasma-enhanced atomic layer deposition (PEALD) processes. In some embodiments SiOCN thin films are not deposited by liquid phase methods. In some embodiments a SiOCN thin film is deposited over a three dimensional structure, such as a fin in the formation of a finFET device.

The formula of the silicon oxycarbonitride films is generally referred to herein as SiOCN for convenience and simplicity. As used herein, SiOCN is not intended to limit, restrict, or define the bonding or chemical state, for example the oxidation state of any of Si, O, C, N, and/or any other element in the film. Further, in some embodiments SiOCN thin films may comprise one or more elements in addition to Si, O, C, and/or N. In some embodiments the SiOCN films may comprise Si—C bonds, Si—O bonds, and/or Si—N bonds. In some embodiments the SiOCN films may comprise Si—C bonds and Si—O bonds and may not comprise Si—N bonds. In some embodiments the SiOCN films may comprise more Si—O bonds than Si—C bonds, for example a ratio of Si—O bonds to Si—C bonds may be from about 1:1 to about 10:1. In some embodiments the SiOCN films may comprise from about 0% to about 10% nitrogen on an atomic basis (at %). In some embodiments the SiOCN may comprise from about 0% to about 30% carbon on an atomic basis. In some embodiments the SiOCN films may comprise from about 0% to about 60% oxygen on an atomic basis. In some embodiments the SiOCN films may comprise about 0% to about 50% silicon on an atomic basis.

ALD-type processes are based on controlled, generally self-limiting surface reactions. Gas phase reactions are typically avoided by contacting the substrate alternately and sequentially with the reactants. Vapor phase reactants are separated from each other in the reaction chamber, for example, by removing excess reactants and/or reactant byproducts between reactant pulses. The reactants may be removed from proximity with the substrate surface with the aid of a purge gas and/or vacuum. In some embodiments excess reactants and/or reactant byproducts are removed from the reaction space by purging, for example with an inert gas.

In some embodiments, plasma enhanced ALD (PEALD) processes are used to deposit SiOCN films. In some embodiments PEALD processes as described herein do not comprise oxygen plasma. Briefly, a substrate or workpiece is placed in a reaction chamber and subjected to alternately repeated surface reactions. In some embodiments, thin SiOCN films are formed by repetition of a self-limiting ALD cycle. In some embodiments, for forming SiOCN films, each ALD cycle comprises at least two distinct phases. The contacting and removal of a reactant from the substrate may be considered a phase. In a first phase, a vapor phase first reactant comprising silicon contacts the substrate and forms no more than about one monolayer on the substrate surface. This reactant is also referred to herein as "the silicon precursor," "silicon-containing precursor," or "silicon reactant" and may be, for example, (3-Aminopropyl)trimethoxysilane (APTMS).

In a second phase, a second reactant comprising a reactive species contacts the substrate and may convert adsorbed silicon to SiOCN. In some embodiments the second reactant comprises a hydrogen precursor. In some embodiments, the reactive species comprises an excited species. In some embodiments the second reactant comprises a species from a hydrogen containing plasma. In some embodiments, the second reactant comprises hydrogen radicals, hydrogen atoms and/or hydrogen plasma. The second reactant may comprise other species that are not hydrogen precursors. In some embodiments, the second reactant may comprise a plasma of nitrogen, radicals of nitrogen, or atomic nitrogen in one form or another. In some embodiments, the second reactant may comprise a species from a noble gas, such as He, Ne, Ar, Kr, or Xe, for example as radicals, in plasma form, or in elemental form. These reactive species from noble gases do not necessarily contribute material to the deposited film, but can in some circumstances contribute to film growth as well as help in the formation and ignition of plasma. In some embodiments a gas that is used to form a plasma may flow constantly throughout the deposition process but only be activated intermittently. In some embodiments a gas that is used to form a plasma does not comprise oxygen. In some embodiments the adsorbed silicon precursor is not contacted with a reactive species generated by a plasma from oxygen. In some embodiments a second reactant comprising reactive species is generated in a gas that does not comprise oxygen. For example in some embodiments a second reactant may comprise a plasma generated in a gas that does not comprise oxygen. In some embodiments the second reactant may be generated in a gas comprising less than about 1 atomic % (at %) oxygen, less than about 0.1 at % oxygen, less than about 0.01 at % oxygen, or less than about 0.001 at % oxygen.

Additional phases may be added and phases may be removed as desired to adjust the composition of the final film.

One or more of the reactants may be provided with the aid of a carrier gas, such as Ar or He. In some embodiments the silicon precursor and the second reactant are provided with the aid of a carrier gas.

In some embodiments, two of the phases may overlap, or be combined. For example, the silicon precursor and the second reactant may be contact the substrate simultaneously in phases that partially or completely overlap. In addition, although referred to as the first and second phases, and the first and second reactants, the order of the phases may be varied, and an ALD cycle may begin with any one of the phases. That is, unless specified otherwise, the reactants can contact the substrate in any order, and the process may begin with any of the reactants.

As discussed in more detail below, in some embodiments for depositing a SiOCN film, one or more deposition cycles begin by contacting the substrate with the silicon precursor, followed by the second precursor. In other embodiments deposition may begin by contacting the substrate with the second precursor, followed by the silicon precursor.

In some embodiments the substrate on which deposition is desired, such as a semiconductor workpiece, is loaded into a reaction space or reactor. The reactor may be part of a cluster tool in which a variety of different processes in the formation of an integrated circuit are carried out. In some embodiments a flow-type reactor is utilized. In some embodiments a shower head type of reactor is utilized. In some embodiments, a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates is in the range of 10 to 200, in the range of 50 to 150, or in the range of 100 to 130.

Examples of suitable reactors that may be used include commercially available equipment such as the F-120® reactor, F-450® reactor, Pulsar® reactors—such as the Pulsar® 2000 and the Pulsar® 3000—EmerALD® reactor and Advance® 400 Series reactors, available from ASM America, Inc of Phoenix, Ariz. and ASM Europe B.V., Almere, Netherlands. Other commercially available reactors include those from ASM Japan K.K (Tokyo, Japan) under the tradename Eagle® XP and XP8.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination. In some embodiments the substrate is pretreated with plasma.

Excess reactant and reaction byproducts, if any, are removed from the vicinity of the substrate, and in particular from the substrate surface, between reactant contacting phases. In some embodiments excess reactant and reaction byproducts, if any, are removed from the substrate surface by, for example, purging the reaction chamber between reactant contacting phases, such as by purging with an inert gas. The flow rate and contacting time of each reactant is tunable, as is the removal step, allowing for control of the quality and various properties of the films.

As mentioned above, in some embodiments a gas is provided to the reaction chamber continuously during each deposition cycle, or during the entire ALD process, and reactive species are provided by generating a plasma in the gas, either in the reaction chamber or upstream of the reaction chamber. In some embodiments the gas comprises nitrogen. In some embodiments the gas is nitrogen. In some embodiments the gas may comprise noble gas, such as helium or argon. In some embodiments the gas is helium or nitrogen. The flowing gas may also serve as a purge gas for the first and/or second reactant (or reactive species). For example, flowing nitrogen may serve as a purge gas for a first silicon precursor and also serve as a second reactant (as a source of reactive species). In some embodiments, nitrogen, argon, or helium may serve as a purge gas for a first precursor and a source of excited species for converting the silicon precursor to the SiOCN film. In some embodiments the gas in which the plasma is generated does not comprise nitrogen and the adsorbed silicon precursor is not contacted with a reactive species generated by a plasma from nitrogen. In some embodiments the gas in which the plasma is generated does not comprise oxygen and the adsorbed silicon precursor is not contacted with a reactive species generated by a plasma from oxygen.

The cycle is repeated until a film of the desired thickness and composition is obtained. In some embodiments the deposition parameters, such as the precursor flow rate, contacting time, removal time, and/or reactants themselves, may be varied in one or more deposition cycles during the ALD process in order to obtain a film with the desired characteristics.

In some embodiments the surface of the substrate is contacted with a reactant. In some embodiments a pulse of reactant is provided to a reaction space containing the substrate. The term "pulse" may be understood to comprise feeding reactant into the reaction chamber for a predetermined amount of time. The term "pulse" does not restrict the length or duration of the pulse and a pulse can be any length of time. In some embodiments the substrate is moved to a reaction space containing a reactant. In some embodiments the substrate is subsequently moved from a reaction space containing a first reactant to a second, different reaction space containing the second reactant.

In some embodiments, the substrate is contacted with the silicon reactant first. After an initial surface termination, if necessary or desired, the substrate is contacted with a first silicon reactant. In some embodiments a first silicon reactant pulse is supplied to the workpiece. In accordance with some embodiments, the first reactant pulse comprises a carrier gas flow and a volatile silicon species, such as APTMS, that is reactive with the workpiece surfaces of interest. Accordingly, the silicon reactant adsorbs upon these workpiece surfaces. The first reactant pulse self-saturates the workpiece surfaces such that any excess constituents of the first reactant pulse do not further react with the molecular layer formed by this process.

The first silicon reactant pulse can be supplied in gaseous form. The silicon precursor gas is considered "volatile" for purposes of the present description if the species exhibits sufficient vapor pressure under the process conditions to transport the species to the workpiece in sufficient concentration to saturate exposed surfaces.

In some embodiments the silicon reactant contacts the surface from about 0.05 seconds to about 5.0 seconds, about 0.1 seconds to about 3 seconds or about 0.2 seconds to about 1.0 seconds. The optimum contacting time can be readily determined by the skilled artisan based on the particular circumstances.

After sufficient time for about a molecular layer to adsorb on the substrate surface, excess first silicon reactant, and reaction byproducts, if any, are removed from the substrate surface. In some embodiments removing excess reactant and reaction byproducts, if any, may comprise purging the reaction chamber. In some embodiments the reaction chamber may be purged by stopping the flow of the first reactant while continuing to flow a carrier gas or purge gas for a sufficient time to diffuse or purge excess reactants and reactant byproducts, if any, from the reaction space. In some embodiments the excess first precursor is purged with the aid of inert gas, such as nitrogen or argon, which is flowing throughout the ALD cycle. In some embodiments the substrate may be moved from the reaction space containing the first reactant to a second, different reaction space. In some embodiments, the first reactant is removed for about 0.1 seconds to about 10 seconds, about 0.3 seconds to about 5 seconds or about 0.3 seconds to about 1 second. Contacting and removal of the silicon reactant can be considered the first or silicon phase of the ALD cycle.

In the second phase, a second reactant comprising a reactive species, such as hydrogen plasma is provided to the workpiece. Hydrogen plasma may be formed by generating a plasma in hydrogen in the reaction chamber or upstream of the reaction chamber, for example by flowing the hydrogen ($H_2$) through a remote plasma generator.

In some embodiments, plasma is generated in flowing $H_2$ gas. In some embodiments $H_2$ is provided to the reaction chamber before the plasma is ignited or hydrogen atoms or radicals are formed. In some embodiments the $H_2$ is provided to the reaction chamber continuously and hydrogen containing plasma, atoms or radicals is created or supplied when needed.

Typically, the second reactant, for example comprising hydrogen plasma, contacts the substrate for about 0.1 seconds to about 10 seconds. In some embodiments the second reactant, such as hydrogen containing plasma, contacts the substrate for about 0.1 seconds to about 10 seconds, 0.5 seconds to about 5 seconds or 0.5 seconds to about 2.0 seconds. However, depending on the reactor type, substrate type and its surface area, the second reactant contacting time may be even higher than about 10 seconds. In some embodiments, contacting times can be on the order of minutes. The optimum contacting time can be readily determined by the skilled artisan based on the particular circumstances.

In some embodiments the second reactant is provided in two or more distinct pulses, without introducing another reactant in between any of the two or more pulses. For example, in some embodiments a plasma, such as a hydrogen containing plasma, is provided in two or more sequential pulses, without introducing a Si-precursor in between the sequential pulses. In some embodiments during provision of plasma two or more sequential plasma pulses are generated by providing a plasma discharge for a first period of time, extinguishing the plasma discharge for a second period of time, for example from about 0.1 seconds to about 10 seconds, from about 0.5 seconds to about 5 seconds or about 1.0 seconds to about 4.0 seconds, and exciting it again for a third period of time before introduction of another precursor or a removal step, such as before the Si-precursor or a purge step. Additional pulses of plasma can be introduced in the same way. In some embodiments a plasma is ignited for an equivalent period of time in each of the pulses.

In some embodiments plasma, for example hydrogen containing plasma may be generated by applying RF power of from about 10 W to about 2000 W, from about 50 W to about 1000 W, or from about 100 W to about 500 W in some embodiments. In some embodiments, a plasma power used for generating a nitrogen-containing plasma can be about 500 W to about 1,500 W, 700 W to about 1200 W or about 800 W to about 1,000 W. In some embodiments the RF power density may be from about 0.02 $W/cm^2$ to about 2.0 $W/cm^2$, or from about 0.05 $W/cm^2$ to about 1.5 $W/cm^2$. The RF power may be applied to second reactant that flows during the plasma contacting time, that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated between a susceptor (on top of which the substrate is located) and a showerhead plate. In some embodiments the gap between the susceptor and showerhead plate is from about 0.1 cm to about 20 cm, from about 0.5 cm to about 5 cm, or from about 0.8 cm to about 3.0 cm.

After a time period sufficient to completely saturate and react the previously adsorbed molecular layer with the plasma pulse, any excess reactant and reaction byproducts are removed from the substrate surface.

In some embodiments removing excess reactant and reaction byproducts, if any, may comprise purging the reaction chamber. In some embodiments the reaction chamber may be purged by stopping the flow of the second reactant while continuing to flow a carrier gas or purge gas for a sufficient time to diffuse or purge excess reactants and reactant byproducts, if any, from the reaction space. In some embodiments the excess second precursor is purged with the aid of inert gas, such as nitrogen or argon, which is flowing throughout the ALD cycle. In some embodiments the substrate may be moved from the reaction space containing the second reactant to a different reaction space. The removal may, in some embodiments, be from about 0.1 seconds to about 10 seconds, about 0.1 seconds to about 4 seconds or about 0.1 seconds to about 0.5 seconds. Together, the reactive species contacting and removal represent a second, reactive species phase in a SiOCN atomic layer deposition cycle.

The two phases together represent one ALD cycle, which is repeated to form SiOCN thin films of a desired thickness. While the ALD cycle is generally referred to herein as beginning with the silicon phase, it is contemplated that in other embodiments the cycle may begin with the reactive species phase. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first ALD cycle, in subsequent cycles the reactive species phase will effectively follow the silicon phase. In some embodiments one or more different ALD cycles are provided in the deposition process.

According to some embodiments of the present disclosure, PEALD reactions may be performed at temperatures ranging from about 25° C. to about 700° C., from about 50° C. to about 600° C., from about 100° C. to about 450° C., or from about 200° C. to about 400° C. In some embodiments, the optimum reactor temperature may be limited by the maximum allowed thermal budget. Therefore, in some embodiments the reaction temperature is from about 300° C. to about 400° C. In some applications, the maximum temperature is around about 400° C., and, therefore the PEALD process is run at that reaction temperature.

The substrate on which a thin film is deposited may comprise various types of materials. In some embodiments the substrate may comprise an integrated circuit workpiece. In some embodiments the substrate may comprise silicon. In some embodiments the substrate may comprise silicon oxide, for example, thermal oxide. In some embodiments the substrate may comprise a high-k dielectric material. In some embodiments the substrate may comprise carbon. For example the substrate may comprise an amorphous carbon layer, graphene, and/or carbon nanotubes.

In some embodiments the substrate may comprise a metal, including, but not limited to W, Cu, Ni, Co, and/or Al. In some embodiments the substrate may comprise a metal nitride, including, but not limited to TiN and/or TaN. In some embodiments the substrate may comprise a metal carbide, including, but not limited to TiC and/or TaC. In some embodiments the substrate may comprise a metal chalcogenide, including, but not limited to $MoS_2$, $Sb_2Te_3$, and/or GeTe. In some embodiments the substrate may comprise a material that would be oxidized by exposure to an oxygen plasma process, but not by a PEALD process as described herein.

In some embodiments a substrate used in the PEALD processes described herein may comprise an organic material. For example, the substrate may comprise an organic material such as a plastic, polymer, and/or photoresist. In some embodiments where the substrate comprises an organic material the reaction temperature of a PEALD process may be less than about 200° C. In some embodiments the reaction temperature may be less than about 150° C., less than about 100° C., less than about 75° C., or less than about 50° C.

In some embodiments where a substrate comprises an organic material the maximum process temperature may be as low as 100° C. In some embodiments where the substrate comprises an organic material, the absence of a plasma generated from oxygen may allow for deposition of a SiOCN thin film on an organic material that may not otherwise degrade in a deposition process including plasma generated from oxygen.

According to some embodiments of the present disclosure, the pressure of the reaction chamber during processing is maintained at from about 0.01 Torr to about 50 Torr, or from about 0.1 Torr to about 10 Torr. In some embodiments the pressure of the reaction chamber is greater than about 6 Torr, or about 20 Torr. In some embodiments, a SiOCN deposition process can be performed at a pressure of about 20 Torr to about 500 Torr, about 20 Torr to about 50 Torr, or about 20 Torr to about 30 Torr.

In some embodiments a SiOCN deposition process can comprise a plurality of deposition cycles, wherein at least one deposition cycle is performed in an elevated pressure regime. For example, a deposition cycle of a PEALD process may comprise alternately and sequentially contacting the substrate with a silicon precursor and a second reactant under the elevated pressure. In some embodiments, one or more deposition cycles of the PEALD process can be performed at a process pressure of about 6 Torr to about 500 Torr, about 6 Torr to about 50 Torr, or about 6 Torr to about 100 Torr. In some embodiments, the one or more deposition cycles can be performed at a process pressure of greater than about 20 Torr, including about 20 Torr to about 500 Torr, about 30 Torr to about 500 Torr, about 40 Torr to about 500 Torr, or about 50 Torr to about 500 Torr. In some embodiments, the one or more deposition cycles can be performed at a process pressure of about 20 Torr to about 30 Torr, about 20 Torr to about 100 Torr, about 30 Torr to about 100 Torr, about 40 Torr to about 100 Torr or about 50 Torr to about 100 Torr.

PEALD of SiOCN

As mentioned above, and discussed in more detail below, in some embodiments SiOCN thin films can be deposited on a substrate in a reaction space by a plasma enhanced atomic deposition layer (PEALD) process. According to some embodiments, a SiOCN thin film is deposited using a PEALD process on a substrate having three-dimensional features, such as in a FinFET application. In some embodiments a PEALD process as described herein may be used in a variety of applications. For example, a PEALD process as described herein may be used in the formation of hardmask layers, sacrificial layers, protective layers, or low-k spacers. A PEALD process as described herein may be used in, for example, memory device applications.

In some embodiments a SiOCN thin film may be deposited by a PEALD process as described herein on a substrate that is not able to withstand O plasma without damage, for example a substrate comprising an organic and/or photoresist material.

Referring to FIG. 1 and according to some embodiments a SiOCN thin film is deposited on a substrate in a reaction space by a PEALD deposition process 100 comprising at least one cycle comprising:

contacting the substrate with a vapor phase silicon-containing precursor at step 120 such that silicon species adsorb onto the surface of the substrate;

removing excess silicon-containing precursor and reaction byproducts, if any, from the substrate surface at step 130;

contacting the substrate with a second reactant comprising reactive species generated by plasma at step 140, thereby converting the adsorbed silicon species into SiOCN;

removing excess second reactant and reaction byproducts, if any, from the substrate surface at step 150; and optionally repeating the contacting and removing steps at step 160 to form a SiOCN thin film of a desired thickness and composition.

In some embodiments step 140 may comprise remotely generating or forming plasma or reactive species before contacting the substrate with the second reactant.

According to some embodiments a SiOCN plasma enhanced ALD deposition cycle can be used to deposit a SiOCN thin film. In certain embodiments, a SiOCN thin film is formed on a substrate by an ALD-type process comprising multiple SiOCN deposition cycles, each SiOCN deposition cycle comprising:

contacting a substrate with a vapor phase silicon reactant such that a silicon compound adsorbs on the substrate surface;

exposing the substrate to a purge gas and/or vacuum;

contacting the substrate with reactive species generated by forming a plasma in a second reactant; and exposing the substrate to a purge gas and/or vacuum;

optionally repeating the contacting and exposing steps until a SiOCN thin film of a desired thickness and composition is obtained.

In some embodiments the exposing the substrate to a purge gas and/or vacuum steps may comprise continuing the flow of an inert carrier gas while stopping the flow of a precursor or reactant. In some embodiments the exposing the substrate to a purge gas and/or vacuum steps may comprise stopping the flow of a precursor and a carrier gas into a reaction chamber and evacuating the reaction chamber, for example with a vacuum pump. In some embodiments the exposing the substrate to a purge gas and/or vacuum steps may comprise moving the substrate from a first reaction chamber to a second, different reaction chamber containing a purge gas. In some embodiments the exposing the substrate to a purge gas and/or vacuum steps may comprise moving the substrate from a first reaction chamber to a second, different reaction chamber under a vacuum.

According to some embodiments a SiOCN thin film is deposited on a substrate in a reaction space by a PEALD deposition process comprising at least one cycle comprising:

contacting the substrate with APTMS such that silicon species adsorb onto the surface of the substrate;

removing excess APTMS and reaction byproducts, if any, from the substrate surface;

contacting the substrate with a second reactant comprising reactive species generated by plasma, wherein the reactive species comprises hydrogen;

removing excess second reactant and reaction byproducts, if any, from the substrate surface; and optionally repeating the contacting and removing steps to form a SiOCN thin film of a desired thickness and composition.

In some embodiments contacting the substrate with a second reactant may comprise remotely generating or forming plasma or reactive species before contacting the substrate with the second reactant.

In certain embodiments, a SiOCN thin film is formed on a substrate by an ALD-type process comprising multiple SiOCN deposition cycles, each SiOCN deposition cycle comprising: alternately and sequentially contacting the substrate with a first vapor phase silicon precursor and a second reactant comprising reactive species. In some embodiments the silicon precursor may comprise APTMS and the second reactive species may comprise hydrogen.

In some embodiments, the PEALD process is performed at a temperature between about 100° C. to about 650° C., about 100° C. to about 550° C., about 100° C. to about 450° C., about 200° C. to about 600° C., or at about 200° C. to about 400° C. In some embodiments the temperature is about 300° C. In some embodiments, for example where a substrate comprises an organic material such as an organic photoresist, the PEALD process may be performed at a temperature less than about 100° C. In some embodiments the PEALD process is performed at a temperature less than about 75° C., or less than about 50° C. In some embodiments a plasma may be generated by applying RF power to the second reactant. The RF power may be applied to second reactant to thereby generate reactive species. In some embodiments the RF power may be applied to the second reactant that flows continuously through the reaction chamber, and/or that flows through a remote plasma generator. Thus in some embodiments the plasma is generated in situ, while in other embodiments the plasma is generated remotely. In some embodiments the RF power applied to the second reactant is from about 10 W to about 2000 W, from about 100 W to about 1000 W or from about 200 W to about 500 W. In some embodiments the RF power applied to the second reactant is about 200 W. In some embodiments, a plasma power used for generating a nitrogen-containing plasma can be about 500 W to about 1500 W, about 800 W to about 1200 W.

As discussed in more detail below, in some embodiments for depositing a SiOCN film, one or more PEALD deposition cycles begin with provision of the silicon precursor, followed by the second reactant. In other embodiments deposition may begin with provision of the second reactant, followed by the silicon precursor. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first PEALD cycle, in subsequent PEALD cycles the reactive species phase will effectively follow the silicon phase. In some embodiments one or more different PEALD sub-cycles are provided in the process for forming a SiOCN thin film.

Si Precursors

A number of different suitable Si precursors can be used in the presently disclosed PEALD processes. In some embodiments, at least some Si precursors suitable for deposition of SiOCN by PEALD processes have the following general formula:

(1)

Wherein x=1-4, $R^I$ may be an independently selected alkyl group, $R^{II}$ may be an independently selected hydrocarbon group, and $R^{III}$ and $R^{IV}$ may be independently selected alkyl groups and/or hydrogens. In some embodiments $R^I$ and $R^{II}$ are $C_1$-$C_3$ alkyl ligands, such as methyl, ethyl, n-propyl, or isopropyl. In some embodiments $R^I$ may be a $C_1$-$C_4$ alkyl ligand, such as methyl, ethyl, n-propyl, isopropyl, or tertbutyl. In some embodiments $R^{II}$ is not a $C_3$ hydrocarbon. In some embodiments $R^{II}$ is a $C_1$-$C_2$ hydrocarbon or a $C_4$-$C_6$ hydrocarbon. In some embodiments $R^{II}$ may be an unsaturated hydrocarbon, such as a hydrocarbon containing one or more double bonds. In some embodiments $R^{II}$ may be an alkyl group where one of the hydrogens is removed. In some embodiments $R^{III}$ and $R^{IV}$ are hydrogen. In some embodiments $R^{I}$ is methyl, $R^{II}$ is n-propyl, $R^{III}$ is hydrogen, $R^{IV}$ is hydrogen, and x=1.

For example, an Si precursor may have the formula (written in a more detailed manner in order to show bonding): $(R^{I}$—O—$)_{4-x}$Si(—$R^{II}$—$NR^{III}$—$R^{IV}$)x, wherein x=1-4, $R^{1}$ may be an independently selected alkyl group, $R^{II}$ may be an independently selected hydrocarbon, and $R^{III}$ and $R^{IV}$ may be independently selected alkyl groups and/or hydrogens.

According to some embodiments, some Si precursors may have the following general formula:

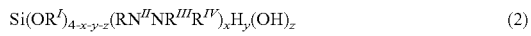

$$Si(OR^I)_{4-x-y-z}(RN^{II}NR^{III}R^{IV})_x H_y(OH)_z \qquad (2)$$

wherein x=1-4, y=0-3, and z=0-3, $R^{I}$ and $R^{II}$ may be an independently selected alkyl group, $R^{II}$ may be an independently selected hydrocarbon, and $R^{III}$ and $R^{IV}$ may be independently selected alkyl groups and/or hydrogens. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$L_n Si(OR^I)_{4-x-n}(R^{II}NR^{III}R^{IV})_x \qquad (3)$$

wherein n=1-3, x=0-3, $R^{I}$ may be an independently selected alkyl group, $R^{II}$ may be an independently selected hydrocarbon, and $R^{III}$ and $R^{IV}$ may be independently selected alkyl groups and/or hydrogens, and L is an independently selected alkyl group or halogen. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

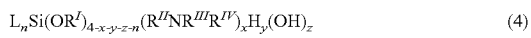

$$L_n Si(OR^I)_{4-x-y-z-n}(R^{II}NR^{III}R^{IV})_x H_y(OH)_z \qquad (4)$$

wherein n=0-3 x=1-4, y=0-3, z=0-3, $R^{I}$ may be an independently selected alkyl group, $R^{II}$ may be an independently selected hydrocarbon, and $R^{III}$ and $R^{IV}$ may be independently selected alkyl groups and/or hydrogens, and L is an independently selected alkyl group or halogen. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$(R^I O)_{4-x} Si(R^{II}—NH_2)_x \qquad 5)$$

wherein x=1-4, $R^{I}$ may be an independently selected alkyl group, and $R^{II}$ may be an independently selected hydrocarbon. In some embodiments $R^{I}$ and $R^{II}$ are $C_1$-$C_3$ alkyl ligands, such as methyl, ethyl, n-propyl, or isopropyl. In some embodiments $R^{I}$ is methyl, $R^{II}$ is n-propyl and x=1. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$(R^I O)_3 Si—R^{II}—NH_2 \qquad 6)$$

Wherein, $R^{I}$ may be an independently selected alkyl group, and $R^{II}$ may be an independently selected hydrocarbon. In some embodiments $R^{I}$ and $R^{II}$ are $C_1$-$C_3$ alkyl ligands, such as methyl, ethyl, n-propyl, or isopropyl. In some embodiments $R^{II}$ may be an unsaturated hydrocarbon, such as a hydrocarbon containing one or more double bonds. In some embodiments $R^{II}$ may be an alkyl group where one of the hydrogens is removed.

According to some embodiments, some Si precursors may have the following general formula:

$$(R^I O)_{4-x} Si(—[CH_2]_n—NH_2)_x \qquad 7)$$

wherein x=1-4, n=1-5, and $R^{I}$ may be an independently selected alkyl group. In some embodiments $R^{I}$ is a $C_1$-$C_4$ alkyl ligand, such as methyl, ethyl, n-propyl, or isopropyl. In some embodiments $R^{I}$ is methyl, and x=1.

In some embodiments the silicon precursor does not comprise a halogen. In some embodiments the silicon precursor may comprise at least one aminoalkyl ligand. According to some embodiments a suitable silicon precursor may comprise at least one ligand which is bonded through carbon to silicon and contains at least one $NH_2$-group attached to a carbon chain, for example an aminoalkyl ligand. According to some embodiments a suitable silicon precursor may comprise at least one ligand which is bonded through carbon to silicon and contains an $NH_2$-group attached to a carbon chain, for example an aminoalkyl ligand, and may also comprise at least one ligand which is bonded to silicon through an oxygen atom and in which an alkyl group is bonded to oxygen, for example an alkoxide ligand. According to some embodiments a suitable silicon precursor may comprise at least one ligand which is bonded through carbon to silicon and contains at least one $NR^{III}R^{IV}$-group, wherein $R^{III}$ and $R^{IV}$ may be independently selected alkyl groups and/or hydrogens, attached to a carbon chain, for example an aminoalkyl ligand. According to some embodiments a suitable silicon precursor may comprise at least one ligand which is bonded through carbon to silicon and in which ligand at least one nitrogen is bonded to carbon. Further the one ligand which is bonded through carbon to silicon and in which ligand at least one nitrogen is bonded to carbon may comprise hydrogen bonded to nitrogen. According to some embodiments, in addition to a ligand which is bonded to silicon through carbon, a suitable silicon precursor may comprise also an alkoxy ligand, such as methoxy, ethoxy, n-propoxy, i-propoxy or tertbutoxy ligand. According to some embodiments, including some of the formulas of the above, a suitable silicon precursor comprises a carbon chain which is bonded to silicon through carbon, and in which there is an amino group, such as alkylamino or —$NH_2$ group, attached to the carbon chain and the carbon chain is a C1-C6 hydrocarbon, C2-C6 hydrocarbon or C2-C4 hydrocarbon, linear, branched or cyclic, containing only carbon and hydrogen. In some embodiments the carbon chain may be unsaturated and contain double carbon-carbon bonds. In some other embodiments the carbon chain may contain other atoms than carbon and hydrogen.

According to some embodiments suitable silicon precursors can include at least compounds having any of the general formulas (1) through (7). In some embodiments halides/halogens can include F, Cl, Br, and I. In some embodiments the silicon precursor can comprise (3-aminopropyl)trimethoxysilane (APTMS).

In some embodiments more than one silicon precursor may contact the substrate surface at the same time during an ALD phase. In some embodiments the silicon precursor may comprise more than one of the silicon precursors described herein. In some embodiments a first silicon precursor is used in a first ALD cycle and a second, different ALD precursor is used in a later ALD cycle. In some embodiments multiple silicon precursors may be used during a single ALD phase, for example in order to optimize certain properties of the deposited SiOCN film. In some embodiments only one silicon precursor may contact the substrate during the deposition. In some embodiments there may only be one silicon precursor and one second reactant or composition of second reactants in the deposition process. In some embodiments there is no metal precursor in the deposition process. In some embodiments the silicon precursor is not used as a silylating agent. In some embodiments the deposition temperature and/or the duration of the silicon precursor contacting step are selected such that the silicon precursor does not decompose. In some embodiments the silicon precursor may decompose during the silicon precursor contacting step. In some embodiments the silicon precursor does not comprise a halogen, such as chlorine or fluorine.

Second Reactants

As discussed above, the second reactant for depositing SiOCN according to the present disclosure may comprise a hydrogen precursor, which may comprise a reactive species. In some embodiments a reactive species includes, but is not limited to, radicals, plasmas, and/or excited atoms or species. Such reactive species may be generated by, for example, plasma discharge, hot-wire, or other suitable methods. In some embodiments the reactive species may be generated remotely from the reaction chamber, for example up-stream from the reaction chamber ("remote plasma"). In some embodiments the reactive species may be generated in the reaction chamber, in the direct vicinity of the substrate, or directly above the substrate ("direct plasma").

Suitable plasma compositions of a PEALD process include hydrogen reactive species, that is plasma, radicals of hydrogen, or atomic hydrogen in one form or another. In some embodiments a second reactant may comprise a reactive species formed at least in part from $H_2$. In some embodiments, nitrogen reactive species in the form of plasma, radicals of nitrogen, or atomic nitrogen in one form or another are also provided. And in some embodiments, a plasma may also contain noble gases, such as He, Ne, Ar, Kr and Xe, or Ar or He, in plasma form, as radicals, or in atomic form. In some embodiments, the second reactant does not comprise any species generated from oxygen. Thus, in some embodiments reactive species are not generated from a gas containing oxygen. In some embodiments a second reactant comprising reactive species is generated from a gas that does not contain oxygen. For example in some embodiments a second reactant may comprise a plasma generated from a gas that does not contain oxygen. In some embodiments the second reactant may be generated from a gas containing less than about 1 atomic % (at %) oxygen, less than about 0.1 at % oxygen, less than about 0.01 at % oxygen, or less than about 0.001 at % oxygen. In some embodiments a second reactant does not comprise $O_2$, $H_2O$ or $O_3$.

Thus, in some embodiments the second reactant may comprise reactive species formed from compounds having both N and H, such as $NH_3$ and $N_2H_4$, a mixture of $N_2/H_2$ or other precursors having an N—H bond. In some embodiments the second reactant may be formed, at least in part, from $N_2$. In some embodiments the second reactant may be formed, at least in part, from $H_2$ and $N_2$, where the $H_2$ and $N_2$ are provided at a flow ratio ($H_2/N_2$), from about 100:1 to about 1:100, from about 20:1 to about 1:20, from about 10:1 to about 1:10, from about 5:1 to about 1:5 and/or from about 2:1 to about 4:1, and in some cases 1:1. For example, a hydrogen-containing plasma for depositing SiOCN can be generated using both $N_2$ and $H_2$ at one or more ratios described herein.

In some embodiments, a hydrogen plasma may be free or substantially free of nitrogen-containing species (e.g., nitrogen ions, radicals, atomic nitrogen). For example, nitrogen-containing gas is not used to generate the hydrogen plasma. In some embodiments, nitrogen-containing gas (e.g., $N_2$ gas) is not flowed into the reaction chamber during the hydrogen plasma step.

In some embodiments, a hydrogen plasma may be free or substantially free of oxygen-containing species (e.g., oxygen ions, radicals, atomic oxygen). For example, oxygen-containing gas is not used to generate the hydrogen plasma. In some embodiments, oxygen-containing gas (e.g., $O_2$ gas) is not flowed into the reaction chamber during the hydrogen plasma step.

In some embodiments, the second reactant does not comprise any species generated from nitrogen. Thus, in some embodiments reactive species are not generated from a gas containing nitrogen. In some embodiments a second reactant comprising reactive species is generated from a gas that does not contain nitrogen. For example in some embodiments a second reactant may comprise a plasma generated from a gas that does not contain nitrogen. In some embodiments the second reactant may be generated from a gas containing less than about 1 atomic % (at %) nitrogen, less than about 0.1 at % nitrogen, less than about 0.01 at % nitrogen, or less than about 0.001 at % nitrogen. In some embodiments a second reactant does not comprise $N_2$, $NH_3$ or $N_2H_4$.

In some embodiments oxygen-containing gas is not used to generate the hydrogen plasma. In some embodiments, oxygen-containing gas (e.g., $O_2$ gas) is not flowed into the reaction chamber during the hydrogen plasma step.

In some embodiments the gas used to generated reactive species, such as plasma, may consist essentially of hydrogen. In some embodiments the gas used to generated reactive species, such as plasma, may consist essentially of nitrogen. In some embodiments the gas used to generated reactive species, such as plasma, may consist essentially of argon or another noble gas. In some embodiments, a plasma power used for generating a hydrogen-containing plasma can be about 10 Watts (W) to about 2,000 W, about 50 W to about –1000 W, about 100 W to about 1000 W or about 100 W to about 500 W. In some embodiments, a plasma power used for generating a hydrogen-containing plasma can be about 100 W to about 300 W.

SiOCN Film Characteristics

SiOCN thin films deposited according to some of the embodiments discussed herein may achieve impurity levels or concentrations below about 3 at %, below about 1 at %, below about 0.5 at %, or below about 0.1 at %. In some thin films, the total impurity level excluding hydrogen may be below about 5 at %, below about 2 at %, below about 1 at %, or below about 0.2 at %. And in some thin films, hydrogen levels may be below about 30 at %, below about 20 at %, below about 15 at %, or below about 10 at %. As used herein, an impurity may be considered any element other than Si, O, C, and/or N.

In some embodiments, the deposited SiOCN films do not comprise an appreciable amount of hydrogen. However, in some embodiments a SiOCN film comprising hydrogen is deposited. In some embodiments, the deposited SiOCN films comprises less than about 30 at %, less than about 20 at %, less than about 15 at %, less than about 10 at % or less than about 5 at % of hydrogen. In some embodiments the thin films do not comprise argon.

According to some embodiments, the SiOCN thin films may exhibit step coverage and pattern loading effects of greater than about 50%, greater than about 80%, greater than about 90%, or greater than about 95%. In some cases step coverage and pattern loading effects can be greater than about 98% and in some case about 100% (within the accuracy of the measurement tool or method). In some embodiments step coverage and pattern loading effects can be greater than about 100%, greater than about 110%, greater than about 120%, greater than about 130%, or greater than about 140%. These values can be achieved in features with aspect ratios of 2 or greater, in some embodiments in aspect ratios of about 3 or greater, in some embodiments in aspect ratios of about 5 or greater and in some embodiments in aspect ratios of about 8 or greater.

In some embodiments the step coverage may be between about 50% and about 110%, between about between about 80% and about 110%, between about 90% and about 110%, between about 95% and 110%, between about 98% and 110%, or between about 100% and 110%. In some embodiments the step coverage may be between about 50% and about 100%, between about between about 80% and about 100%, between about 90% and about 100%, between about 95% and 100%, or between about 98% and 100%.

In some embodiments the growth rate of the film is from about 0.01 Å/cycle to about 5 Å/cycle, from about 0.05 Å/cycle to about 2 Å/cycle. In some embodiments the growth rate of the film is more than about 0.05 Å/cycle, more than about 0.1 Å/cycle, more than about 0.15 Å/cycle, more than about 0.3 Å/cycle, more than about 0.3 Å/cycle, more than about 0.4 Å/cycle. As used herein, "pattern loading effect" is used in accordance with its ordinary meaning in this field. While pattern loading effects may be seen with respect to impurity content, density, electrical properties and etch rate, unless indicated otherwise the term pattern loading effect when used herein refers to the variation in film thickness in an area of the substrate where structures are present. Thus, the pattern loading effect can be given as the film thickness in the sidewall or bottom of a feature inside a three-dimensional structure relative to the film thickness on the sidewall or bottom of the three-dimensional structure/feature facing the open field. As used herein, a 100% pattern loading effect (or a ratio of 1) would represent about a completely uniform film property throughout the substrate regardless of features i.e. in other words there is no pattern loading effect (variance in a particular film property, such as thickness, in features vs. open field).

In some embodiments, SiOCN films are deposited to a thickness of from about 3 nm to about 50 nm, from about 5 nm to about 30 nm, from about 5 nm to about 20 nm. These thicknesses can be achieved in feature sizes (width) below about 100 nm, about 50 nm, below about 30 nm, below about 20 nm, and in some cases below about 15 nm. According to some embodiments, a SiOCN film is deposited on a three-dimensional structure and the thickness at a sidewall may be slightly even more than 10 nm. In some embodiments SiOCN films of greater than 50 nm can be deposited. In some embodiments SiOCN films of greater than 100 nm can be deposited. In some embodiments, SiOCN films are deposited to a thickness of more than about 1 nm, more than about 2 nm, more than about 3 nm, more than about 5 nm, more than about 10 nm. According to some embodiments SiOCN films with various wet etch rates (WER) may be deposited. When using a blanket WER in 0.5% dHF (nm/min), SiOCN films may have WER values of less than about 5, less than about 4, less than about 2, or less than about 1. In some embodiments SiOCN films may have WER values significantly less than 1. In some embodiments SiOCN films may have WER values less than about 0.3, less than about 0.2, or less than about 0.1. In some embodiments SiOCN films may have WER values less than about 0.05, less than about 0.025, or less than about 0.02.

The blanket WER in 0.5% dHF (nm/min) relative to the WER of thermal oxide may be less than about 3, less than about 2, less than about 1, and less than about 0.5. In some embodiments the blanket WER in 0.5% dHF relative to the WER of TOX may be less than about 0.1.

In some embodiments wherein a PEALD process is carried out at temperatures less than about 100° C., The blanket WER in 0.5% dHF (nm/min) relative to the WER of thermal oxide may be less than about 10, less than about 5, less than about 3, and less than about 2, or less than about 1.

And in some embodiments, the sidewall WER of a three dimensional feature, such as a fin or trench relative to the top region WER of a three dimensional feature, such as fin or trench, in 0.5% dHF may be less than about 10, less than about 5, less than about 3, less than about 3, or less than about 1. In some embodiments, SiOCN formed according to one or more processes described herein can advantageously demonstrate a horizontal region to vertical region WERR of about 1, for example in 0.5% dHF. For example, a ratio of a wet etch rate of SiOCN thin film formed over horizontal surfaces (e.g., top surfaces) to a wet etch rate of the SiOCN thin film formed over vertical surfaces (e.g., sidewall surfaces) of three-dimensional structures on a substrate surface can be the same or substantially the same. In some embodiments, the ratio can be about 0.25 to about 2, about 0.5 to about 1.5, about 0.75 to about 1.25, or about 0.9 to about 1.1. These ratios can be achieved in features with aspect ratios of about 2 or more, about 3 or more, about 5 or more or even about 8 or more.

In some embodiments, the amount of etching of SiOCN films according to the present disclosure may be about 1, 2, 5, 10 or more times less than an amount of etching observed for thermal $SiO_2$ (TOX) in a 0.5% HF-dip process (for example in a process in which about 2 to about 3 nm TOX is removed, 1, 2, 5, 10 or more times less SiOCN is removed when deposited according to the methods disclosed herein).

In some embodiments less than about 2 nm of SiOCN film may be removed in a 0.5% HF-dip process with an etching time of 5 minutes. In some embodiments less than about 2 nm of SiOCN film may be removed in a 0.5% HF-dip process with an etching time of 60 minutes.

All atomic percentage (i.e., at %) values provided herein exclude hydrogen for simplicity and because hydrogen is difficult to accurately analyze quantitatively, unless otherwise indicated. However, in some embodiments, if it is possible to analyze the hydrogen with reasonable accuracy, the hydrogen content of the films is less than about 20 at %, less than about 10 at % or less than about 5 at %. In some embodiments the deposited SiOCN thin film may contain up to about 70% oxygen on an atomic basis (at %). In some embodiments a SiOCN film may comprise oxygen from about 10% to about 70%, from about 15% to about 50%, or from about 20% to about 40% on an atomic basis. In some embodiments a SiOCN film may comprise at least about 20%, about 40% or about 50% oxygen on an atomic basis.

In some embodiments the deposited SiOCN thin film may contain up to about 40% carbon on an atomic basis (at %). In some embodiments a SiOCN film may comprise carbon from about 0.5% to about 40%, from about 1% to about 30%, or from about 5% to about 20% on an atomic basis. In some embodiments a SiOCN film may comprise at least about 1%, about 10% or about 20% carbon on an atomic basis.

In some embodiments the deposited SiOCN thin film may contain up to about 30% nitrogen on an atomic basis (at %). In some embodiments a SiOCN film may comprise nitrogen from about 0.51% to about 30%, from about 1% to about 20%, or from about 3% to about 15% on an atomic basis. In some embodiments an SiOCN film may comprise at least about 1%, about 5% or about 10% nitrogen on an atomic basis.

In some embodiments the deposited SiOCN thin film may contain up to about 50% silicon on an atomic basis (at %). In some embodiments a SiOCN film may comprise silicon from about 10X % to about 50%, from about 15% to about 40%, or from about 20% to about 35% on an atomic basis. In some embodiments a SiOCN film may comprise at least about 15%, about 20%, about 25% or about 30% silicon on an atomic basis.

In some embodiments the deposited SiOCN thin film may comprise from about 30 at % to about 40 at % silicon, from about 25 at % to about 40 at % oxygen, from about 10 at % to about 20 at %, and about 10 at % nitrogen. In some embodiments the deposited SiOCN film may comprise about 33% silicon and about 67% oxygen. As discussed above, in some embodiments a SiOCN film may comprise Si—C bonds, Si—O bonds, and/or Si—N bonds. In some embodiments a SiOCN film may comprise Si—C bonds and Si—O bonds and may not comprise Si—N bonds. In some embodiments a SiOCN film may comprise Si—N bonds and Si—O bonds and may not comprise Si—C bonds. In some embodiments a SiOCN film may comprise Si—N bonds and Si—C bonds and may not comprise Si—O bonds. In some embodiments the SiOCN films may comprise more Si—O bonds than Si—C bonds, for example a ratio of Si—O bonds to Si—C bonds may be from about 1:1 to about 10:1. In some embodiments a deposited SiOCN film may comprise one or more of SiN, SiO, SiC, SiCN, SiON, and/or SiOC.

In some embodiments a SiOCN film is not a low-k film, for example a SiOCN film is not a porous film. In some embodiments a SiOCN is a continuous film. In some embodiments a SiOCN film has a k-value that is less than about 10. In some embodiments a SiOCN film has a k-value that is less than about 7. In some embodiments a SiOCN film has a k-values from about 3.9 to about 10. In some embodiments a SiOCN film has a k-value that is less than about 5.5, less than about 5.0, less than about 4.8, less than about 4.6. In some embodiments a SiOCN film has a k-value that from about 3.8 to about 7, from about 3.8 to about 5.5, from about 3.8 to about 5.0, from about 4.0 to about 4.8, from about 4.1 to about 4.7. In some embodiments a SiOCN film has a k-value that is more than k-value of any low-k film. In some embodiments a SiOCN film has a k-value that is more than pure $SiO_2$.

In some embodiments SiOCN films deposited according to the present disclosure do not comprise a laminate or nanolaminate structure.

In some embodiments a SiOCN film deposited according to the present disclosure is not a self-assembled monolayer (SAM). In some embodiments a SiOCN film deposited according to the present disclosure does not consist of separate, individual molecules which are not bonded to each other. In some embodiments a SiOCN film deposited according to the present disclosure comprises a material which is substantially bonded or linked together. In some embodiments a SiOCN film deposited according to the present disclosure is not a functional layer, is not amino-functionalized, and/or is not used as a functional surface. In some embodiments a SiOCN film deposited according to the present disclosure is not terminated with —$NH_2$ groups. In some embodiments a SiOCN film deposited according to the present disclosure does not contain a substantial amount of —$NH_2$ groups.

EXAMPLES

Figure 2:
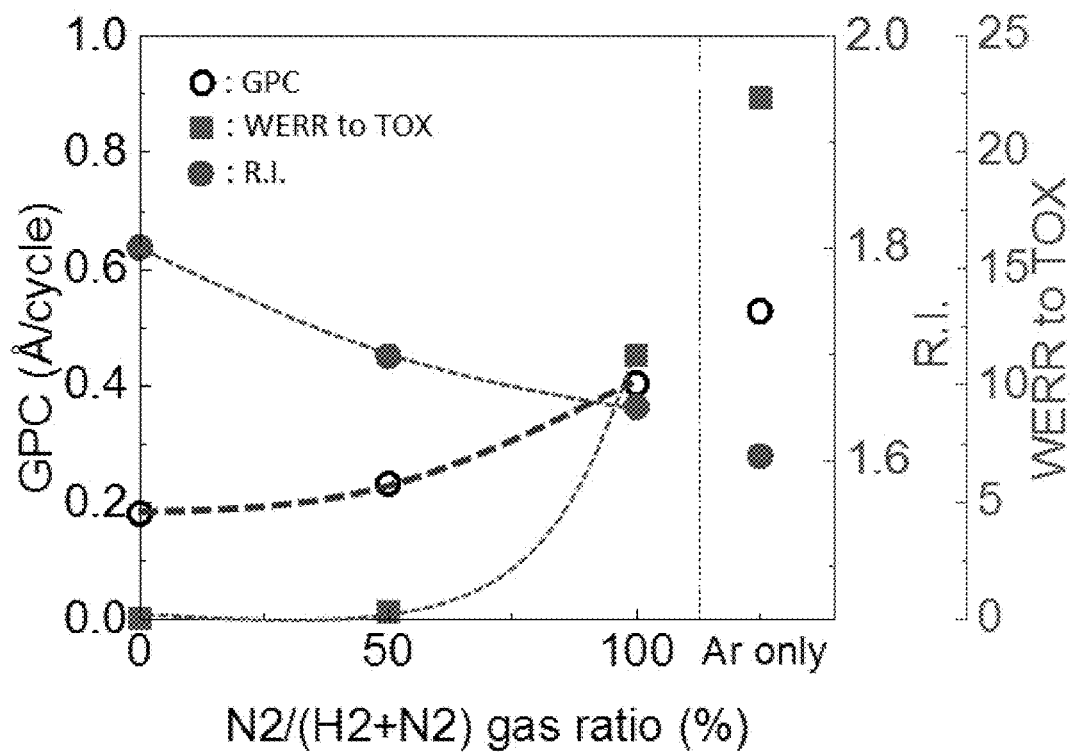
FIG. 2 illustrates film growth per cycle (GPC), refractive index, and wet etch rate ratio (WERR) as a function of second reactant gas mixture ratio for SiOCN thin films deposited according to some embodiments of the present disclosure.

Exemplary SiOCN thin films were deposited by a PEALD process as described herein. The deposition temperature was 300° C. and APTMS was used as a silicon precursor. A plasma was generated by applying 200 W of RF power to the second reactant. A mixture of $H_2$ and $N_2$ was used as the second reactant, which was supplied with an Ar carrier gas. FIG. 2 illustrates the growth per cycle (Å/cycle), refractive index, and WERR as compared with TOX as a function of second reactant gas ratio for SiOCN films deposited by a PEALD process as described herein. The second reactant gas ratio is shown along the X-axis of FIG. 2, and represents the ratio of $N_2$ to both $H_2$ and $N_2$ ($N_2$:($H_2$+$N_2$)) in the second reactant.

As can be seen in FIG. 2, the growth rate of the SiOCN films increased as the $N_2$:($H_2$+$N_2$) ratio in the second reactant increased. The refractive index of the deposited films decreased as the $N_2$:($H_2$+$N_2$) ratio in the second reactant increased. The ratio of the WER of the deposited SiOCN films to the WER of TOX (WERR to TOX) was observed to increase as the $N_2$:($H_2$+$N_2$) ratio in the second reactant increased. Significantly, the WERR to TOX was for SiOCN films deposited with $N_2$:($H_2$+$N_2$) ratios of 50% and 0% (no $N_2$ present in the second reactant) was observed to be less than 1. Without being bound by any one theory, it is believed that the presence of H2 in the second reactant results in high wet chemical resistance in the deposited SiOCN thin film.

Figure 3:
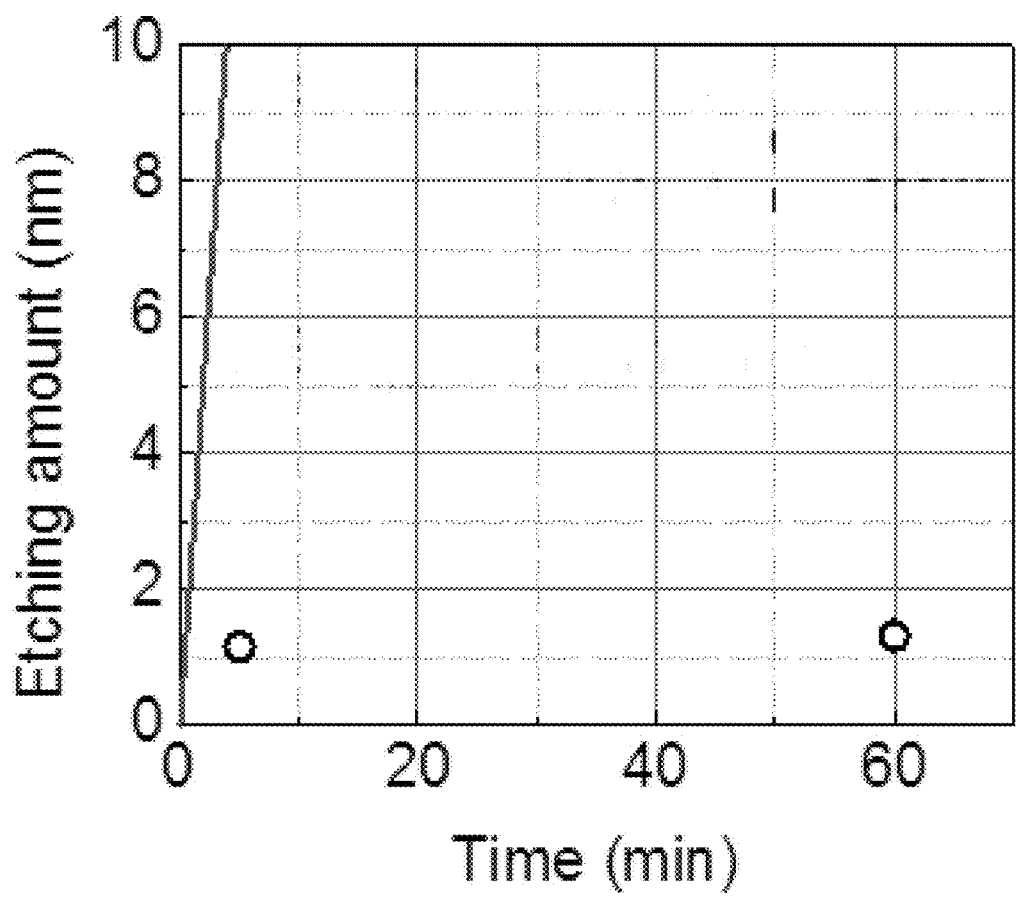
FIG. 3 illustrates etch amount (dHF wet etch) versus etch time for thermal oxide (TOX) and a SiOCN thin film deposited according to some embodiments of the present disclosure.

FIG. 3 illustrates the etching amount versus etching time for both SiOCN thin films deposited by PEALD processes as described herein and TOX. The etching process was a 0.5% HF-dip process. As can be seen in FIG. 3, the deposited SiOCN exhibit significantly greater etch resistance than TOX. After exposure to a 60 minute dip in 0.5% HF less than 2 nm of SiOCN film was removed.

The composition of a SiOCN film deposited by a PEALD process as described herein was analysed using X-ray photoelectron spectroscopy (XPS). The deposition temperature was 300° C. and APTMS was used as a silicon precursor. The results are shown in Table 1, below. Two distinct Si bonding energies were identified, indicating the presence of Si—C and SiO bonds in the deposited film.

TABLE 1

Film composition measure by XPS

| Depth (Å) | O | N | C | $Si_{SiC}$ | $Si_{SiOCN}$ |
|---|---|---|---|---|---|
| 0 | 46.3 | 5.3 | 18.6 | 5.3 | 24.5 |
| 25 | 41.4 | 9.0 | 11.5 | 6.7 | 31.5 |
| 50 | 41.5 | 8.8 | 11.0 | 7.0 | 31.7 |
| 75 | 41.0 | 8.9 | 11.0 | 5.3 | 33.8 |
| 100 | 41.9 | 8.9 | 10.7 | 6.3 | 32.3 |
| 125 | 42.0 | 9.3 | 10.0 | 5.9 | 32.8 |
| 150 | 43.0 | 8.1 | 10.7 | 5.7 | 32.5 |
| 175 | 43.9 | 8.3 | 9.7 | 4.7 | 33.4 |
| 200 | 44.5 | 8.2 | 9.0 | 5.9 | 32.4 |
| 225 | 45.0 | 8.3 | 9.1 | 5.2 | 32.4 |
| 250 | 46.0 | 7.9 | 8.4 | 4.1 | 33.6 |

TABLE 1-continued

| Film composition measure by XPS | | | | | |
|---|---|---|---|---|---|
| Depth (Å) | O | N | C | $Si_{SiC}$ | $Si_{SiOCN}$ |
| 275 | 47.3 | 7.5 | 8.3 | 5.0 | 31.8 |
| 300 | 47.8 | 7.4 | 7.5 | 4.6 | 32.8 |

Figure 4:
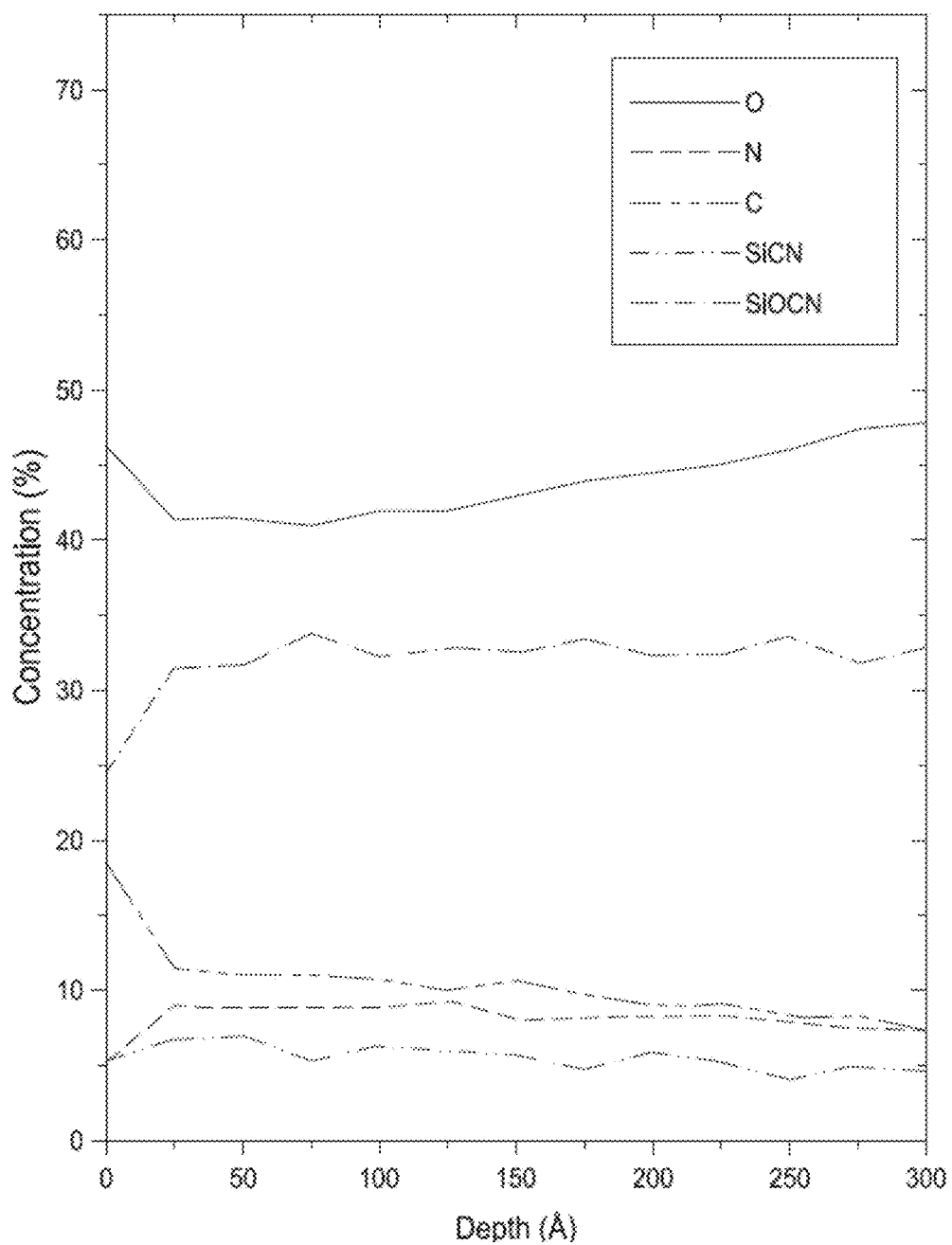
FIG. 4 is a compositional X-ray photoelectron spectroscopy (XPS) depth profile for a SiOCN thin film deposited according to some embodiments of the present disclosure.

FIG. 4 also illustrates film composition as a function depth for an exemplary SiOCN film deposited by a PEALD process as described herein.

Figure 5A:
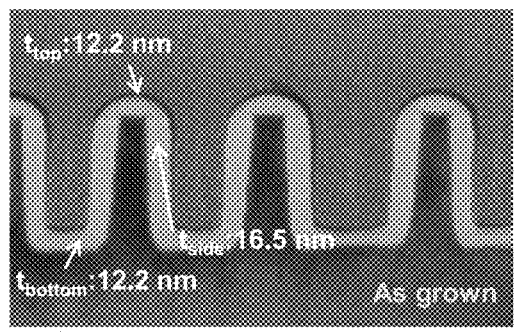
FIGS. 5A-B illustrate transmission electron microscope (TEM) images of a SiOCN thin film deposited according to some embodiments of the present disclosure before and after exposure to a 2-minute dHF dip.
Figure 5B:
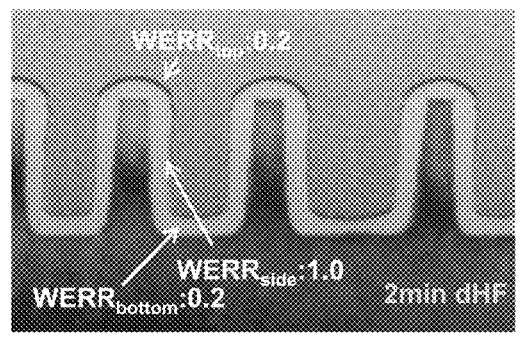
Figure 5C:
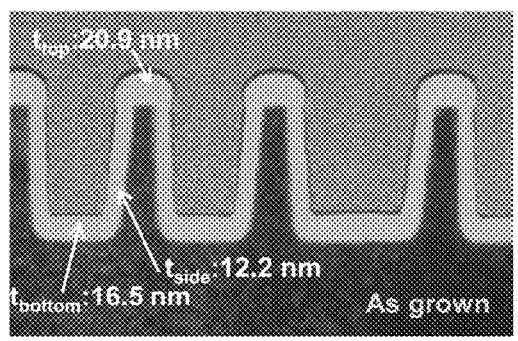
FIGS. 5C-D illustrate transmission electron microscope (TEM) images of a SiOCN thin film deposited according to some embodiments of the present disclosure before and after exposure to a 2-minute dHF dip.
Figure 5D:
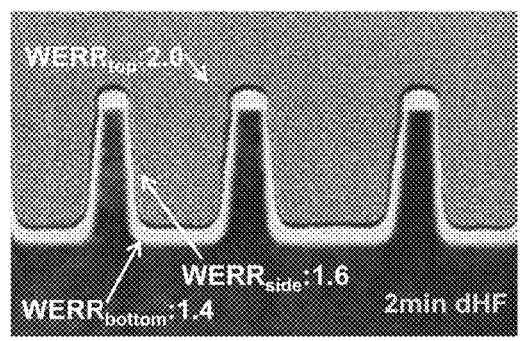

FIGS. 5A and 5B are scanning electron microscopy (SEM) images showing cross-section view of SiOCN films formed on trench structure prior to and after exposure to a 2 minutes dip in dHF wet etch solution, respectively. The SiOCN films of FIGS. 5A and 5B were formed according to the PEALD processes as described herein. The deposition temperature was 300° C. and APTMS was used as a silicon precursor. A plasma was generated by applying 400 W of RF power to the second reactant comprising $H_2$. The plasma pulse time was 8 seconds. FIGS. 5C and 5D are scanning electron microscopy (SEM) images showing cross-section view of SiOCN films formed on trench structure prior to and after exposure to a 2 minutes dip in dHF wet etch solution, respectively. The SiOCN films of FIGS. 5C and 5D were formed according to the PEALD processes as described herein. The deposition temperature was 300° C. and APTMS was used as a silicon precursor. A plasma was generated by applying 400 W of RF power to the second reactant comprising $H_2$ and $N_2$. The plasma pulse time was 8 seconds.

As shown in FIGS. 5A and 5C, the SiOCN film formed using a PEALD process with a second reactant that did not comprise $N_2$ demonstrated improved conformaltity prior to the wet etch dip, as compared to the SiOCN film formed using a PEALD process with a second reactant comprising $H_2$ and $N_2$. The SiOCN film formed with a second reactant that did not comprise $N_2$ had a step coverage of 114% to 136%, while the SiOCN film formed with a second reactant comprising $H_2$ and $N_2$ had a step coverage of 54%. As shown in FIGS. 5B and 5D, the conformality of the SiOCN film formed using a second reactant that did not comprise $N_2$ was maintained subsequent to the wet etch dip, while that of the SiOCN film formed using a second reactant comprising $H_2$ and $N_2$ was decreased.

Additionally, the SiOCN film formed using a second reactant that did not comprise $N_2$ demonstrated a wet etch rate ratio to TOX (WERR to TOX) of 0.2 for the horizontal regions of the film and a WERR to TOX of 1.0 for the vertical regions of the film (sidewall surfaces). The SiOCN film formed using a second reactant comprising $H_2$ and $N_2$ demonstrated a wet etch rate ratio to TOX (WERR to TOX) of 2.0 for the horizontal regions of the film deposited on top of the trench structure, a WERR to TOX of 1.4 for the regions of the film deposited on the bottom of the trench structure, and a WERR to TOX of 1.6 for the vertical regions of the film (sidewall surfaces).

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes or nanoparticles or even single partial or full molecular layers or partial or full atomic layers or clusters of atoms and/or molecules. "Film" and "thin film" may comprise material or layer with pinholes, but still be at least partially continuous.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method of forming a silicon oxycarbonitride (SiOCN) thin film on a substrate in a reaction space by a plasma enhanced atomic layer deposition (PEALD) process, wherein the PEALD process comprises at least one deposition cycle comprising:

contacting a surface of the substrate with a vapor phase silicon precursor to thereby adsorb a silicon species on the surface of the substrate;

contacting the adsorbed silicon species with at least one reactive species generated by plasma formed from gas that does not comprise oxygen, wherein the adsorbed silicon species is not contacted with oxygen-containing reactive species formed from gas; and optionally repeating the contacting steps until a SiOCN film of a desired thickness has been formed;

wherein the silicon precursor is selected from the group consisting of the following general formulas:

$$(R^{I}O)_{4-x}Si(R^{II}-NH_2)_x \qquad (1)$$

wherein x is an integer from 1 to 4;
$R^{I}$ is independently selected from the group consisting of alkyl groups; and
$R^{II}$ is an independently selected from the group consisting of hydrocarbon groups;

$$(R^{I}O)_3Si-R^{II}-NH_2 \qquad (2)$$

wherein $R^{I}$ is independently selected from the group consisting of alkyl groups; and
$R^{II}$ is independently selected from the group consisting of hydrocarbon groups; and

$$(R^{I}O)_{4-x}Si(-[CH_2]_n-NH_2)_x \qquad (3)$$

wherein x is an integer from 1 to 4;
n is an integer from 1-5; and
$R^{I}$ is independently selected from the group consisting of alkyl groups.

2. The method of claim 1, wherein a ratio of a wet etch rate the SiOCN thin film to a wet etch rate of thermal silicon oxide is less than about 5.

3. The method of claim 1, wherein a ratio of a wet etch rate the SiOCN thin film to a wet etch rate of thermal silicon oxide is less than about 0.3.

4. The method of claim 1, wherein a ratio of a wet etch rate the SiOCN thin film to a wet etch rate of thermal silicon oxide is less than about 0.1.

5. The method of claim 1, wherein the SiOCN thin film is deposited on a three-dimensional structure on the substrate.

6. The method of claim 5, wherein a wet etch rate ratio of a wet etch rate of SiOCN formed on a top surface of the three-dimensional structure to a wet etch rate of the SiOCN formed on a sidewall surface of the three-dimensional structure is about 1:1 in dilute HF.

7. The method of claim 1, wherein the vapor phase silicon precursor does not comprise a halogen.

8. The method of claim 1, wherein the silicon precursor comprises (3-aminopropyl)trimethoxysilane (APTMS).

9. The method of claim 1, wherein the reactive species comprises hydrogen plasma, hydrogen atoms, hydrogen radicals, or hydrogen ions.

10. The method of claim 1, wherein the reactive species is generated from a second reactant comprising a noble gas.

11. The method of claim 9, wherein the reactive species further comprises nitrogen plasma, nitrogen atoms, nitrogen radicals, or nitrogen ions.

12. The method of claim 1, wherein the reactive species is generated by plasma from a second reactant comprising hydrogen.

13. The method of claim 12, wherein the second reactant comprises $H_2$.

14. The method of claim 1, wherein the SiOCN thin film comprises at least 20 at % oxygen.

15. The method of claim 1, wherein the SiOCN thin film comprises at least 5 at % carbon.

16. The method of claim 1, wherein the SiOCN thin film comprises at least 5 at % nitrogen.

17. A method of forming a silicon oxycarbonitride (SiOCN) thin film on a substrate in a reaction space comprising a plurality of deposition cycles, wherein at least one deposition cycle comprises:
   alternately and sequentially contacting a surface of the substrate with a silicon precursor and a second reactant comprising at least one reactive species generated by plasma from gas that does not comprise oxygen, wherein the surface of the substrate is not contacted with oxygen-containing reactive species generated from gas;
   wherein the deposition cycle is repeated two or more times to form the SiOCN thin film; and
   wherein the silicon precursor has a general formula:

$L_n Si(OR^I)_{4-x-y-z-n}(R^{II}NR^{III}R^{IV})_x H_y(OH)_z$ wherein n is an integer from 0 to 3, x is an integer from 1 to 4, y is an integer from 0 to 3, z is an integer from 0 to 3; and 4-x-y-z-n is from 0 to 3;
   $R^I$ is independently selected from the group consisting of alkyl groups;
   $R^{II}$ is independently selected from the group consisting of hydrocarbon groups;
   $R^{III}$ and $R^{IV}$ are independently selected from the group consisting of alkyl groups and hydrogen; and
   L is independently selected from the group consisting of alkyl groups and halogens.

18. The method of claim 17, wherein the silicon precursor has a general formula:

$L_n Si(OR^I)_{4-x-n}(R^{II}NR^{III}R^{IV})_x$ wherein n is an integer from 0 to 3, x is an integer from 1 to 3;
   L is independently selected from the group consisting of alkyl groups and halogens;
   $R^I$ is independently selected from the group consisting of alkyl groups;
   $R^{II}$ is independently selected from the group consisting of hydrocarbon groups; and
   $R^{III}$ and $R^{IV}$ are independently selected from the group consisting of alkyl groups and hydrogen.

19. The method of claim 17, wherein the silicon precursor has a general formula:

$Si(OR^I)_{4-x-y-z}(R^{II}NR^{III}R^{IV})_x H_y(OH)_z$ wherein x is an integer from 1 to 4, y is an integer from 0 to 3, z is an integer from 0 to 3;
   $R^I$ is independently selected from the group consisting of alkyl groups;
   $R^{II}$ is independently selected from the group consisting of hydrocarbon groups; and
   $R^{III}$ and $R^{IV}$ are independently selected from the group consisting of alkyl and hydrogen.

20. The method of claim 17, wherein the silicon precursor has a general formula:

$Si(OR^I)_{4-x}(R^{II}NR^{III}R^{IV})_x$ wherein x is an integer from 1 to 4;
   $R^I$ is independently selected from the group consisting of alkyl groups;
   $R^{II}$ is independently selected from the group consisting of hydrocarbon groups; and
   $R_{III}$ and $R_{IV}$ are independently selected from the group consisting of alkyl groups and hydrogen.

21. The method of claim 17, wherein the silicon precursor comprises APTMS.

22. The method of claim 17, wherein at least one deposition cycle is a PEALD cycle.

23. The method of claim 17, wherein a reactive species is generated by applying RF power of 100 Watts (W) to about 1000 W to the second reactant.

24. The method of claim 17, wherein the deposition cycle is carried out at a process temperature of about 300° C. to about 400° C.

25. The method of claim 17, wherein the deposition cycle is carried out at a process temperature of less than about 100° C.

26. The method of claim 17, wherein the substrate comprises an organic material.

27. A method for depositing a silicon oxycarbonitride (SiOCN) thin film on a substrate in a reaction space comprising:
   contacting a surface of the substrate with a silicon precursor comprising;
      at least one ligand bonded through carbon to a silicon atom and containing an $NH_2$-group attached to a carbon chain; and
      at least one ligand bonded to the silicon atom through an oxygen atom and in which an alkyl group is bonded to the oxygen atom;
   exposing the substrate to a purge gas and/or vacuum to remove excess silicon precursor and reaction byproducts, if any;
   contacting a surface of the substrate with a second reactant comprising hydrogen, wherein the second reactant comprises at least one reactive species generated by plasma and wherein surface of the substrate is not contacted with oxygen-containing reactive species generated from gas;
   exposing the substrate to a purge gas and/or vacuum to remove excess second reactant and reaction byproducts, if any;
   repeating the contacting steps until a SiOCN thin film of desired thickness has been formed.

* * * * *